(12) United States Patent
Sugisawa et al.

(10) Patent No.: US 6,570,407 B1
(45) Date of Patent: May 27, 2003

(54) SCANNABLE LATCH FOR A DYNAMIC CIRCUIT

(75) Inventors: Junji Sugisawa, Santa Clara, CA (US); Larry Kan, Fremont, CA (US); David Greenhill, Portola Valley, CA (US); Joseph Siegel, Shrewsbury, MA (US)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

(21) Appl. No.: 10/060,456

(22) Filed: Jan. 30, 2002

(51) Int. Cl.[7] .............................................. H03K 19/096
(52) U.S. Cl. ........................... 326/93; 326/16; 326/95; 326/98; 714/724
(58) Field of Search .............................. 326/16, 93, 95, 326/98; 327/208–212, 214, 215, 224, 225; 714/724, 725

(56) References Cited

U.S. PATENT DOCUMENTS 5,896,046 A * 4/1999 Bjorksten et al. ............ 326/98
6,085,343 A * 7/2000 Krishnamoorthy .......... 714/724
6,252,417 B1 * 6/2001 Adams et al. ................ 326/16

* cited by examiner

*Primary Examiner*—Michael Tokar
*Assistant Examiner*—Vibol Tan
(74) *Attorney, Agent, or Firm*—Rosenthal & Osha L.L.P.

(57) ABSTRACT

A scannable latch for use within a circuit path of a series of one or more dynamic circuits is provided. The scannable latch provides both latch functionality during normal operation and scan test functionality during scan mode operation. Particularly, the scannable latch has a dynamic input stage and a shadow latch, where the dynamic input stage's primary function occurs during normal operations and where the shadow latch's primary function occurs during scan operations. The scannable latch also has an output gate operatively connected to the dynamic input stage and shadow latch.

20 Claims, 11 Drawing Sheets

FIG. 9B

SCANNABLE LATCH FOR A DYNAMIC CIRCUIT

BACKGROUND OF INVENTION

Figure 1:
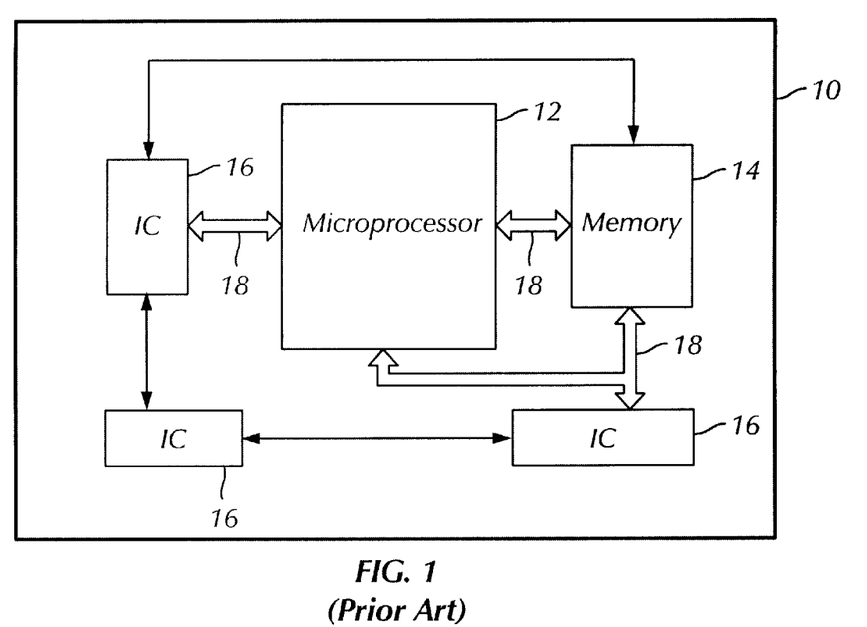
FIG. 1 shows a typical computer system.

A typical computer system includes at least a microprocessor and some form of memory. The microprocessor has, among other components, arithmetic, logic, and control circuitry that interpret and execute instructions necessary for the operation and use of the computer system. FIG. 1 shows a typical computer system (10) having a microprocessor (12), memory (14), integrated circuits (16) that have various functionalities, and communication paths (18), i.e., buses and wires, that are necessary for the transfer of data among the aforementioned components of the computer system (10).

Integrated circuits ("ICs"), such as the ones shown in FIG. 1, often have a number of storage elements, e.g., latches and flip-flops, that store logical states (e.g., HIGH and LOW represented as a "1" and "0," respectively) within the integrated circuit. In normal operation, data from a computer system component is received by one or more storage elements and then is outputted to the same and/or another computer system component.

Figure 2:
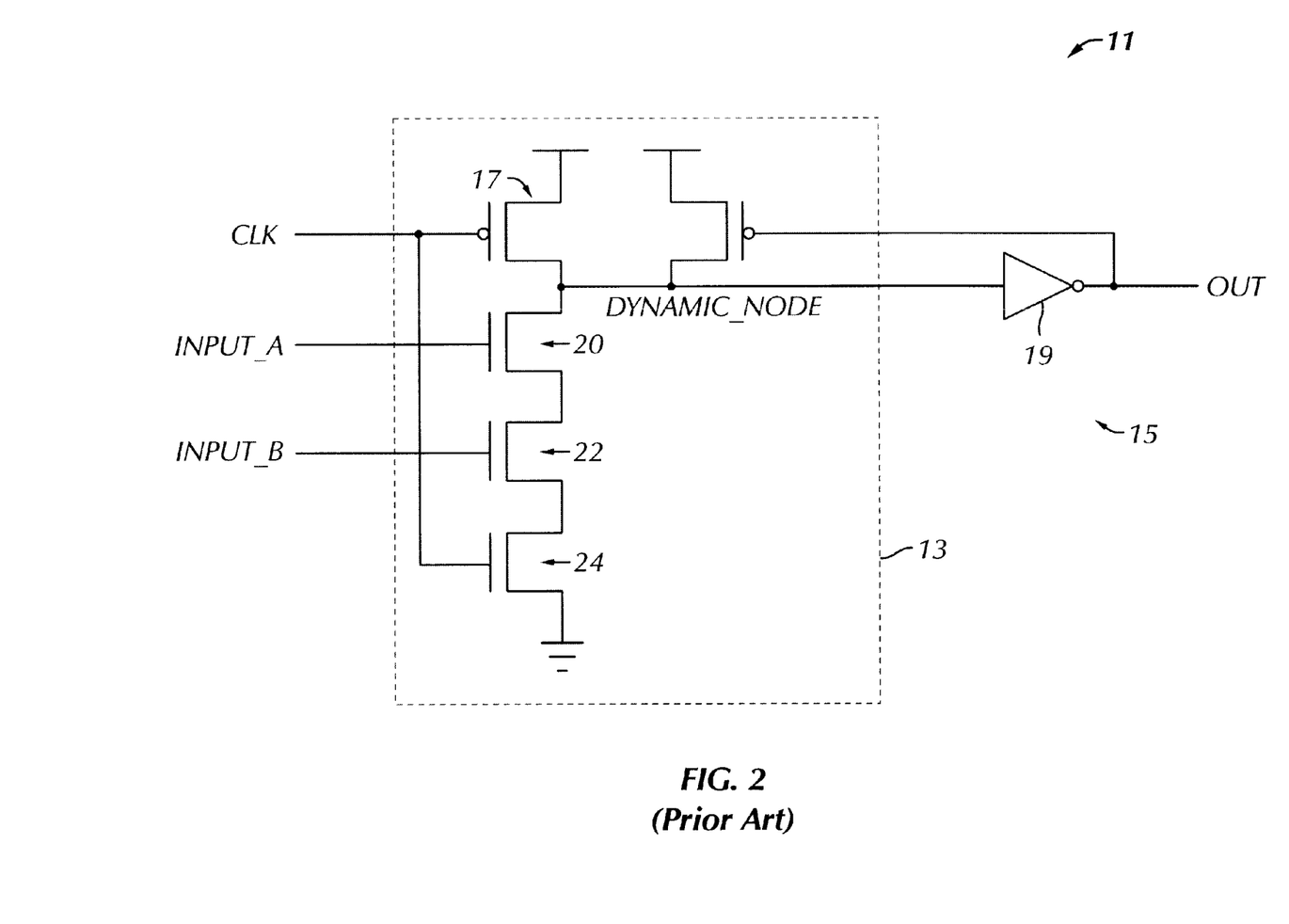
FIG. 2 shows a typical domino gate.

FIG. 2 shows a commonly used type of storage element known in the art as a "domino gate" (11). The domino gate (11) has a dynamic input stage (13) and a static output stage (15). A clock signal (shown in FIG. 2 as CLK and also referred to as "reference clock") serves as an input to the dynamic input stage (13) and essentially "clocks" the domino gate (11). Further, the domino gate (11) has a first input signal (shown in FIG. 2 as INPUT_A), and a second input signal (shown in FIG. 2 as INPUT_B). Although FIG. 21 shows the domino gate (11) having only two inputs, other conventional domino gates may have different amount of input signals.

The operation of the domino gate (11) is as follows. When the clock signal is low, a dynamic node (shown in FIG. 2 as DYNAMIC_NODE) is precharged high through a transistor (17), and an output node (shown in FIG. 2 as OUT) of the domino gate (11) is set to low via an inverter (19) in the static output stage (15). The period in which the clock signal is low is referred to as the "precharge phase." A rising transition on the clock signal conditionally discharges the dynamic node through a pulldown network formed by a series of transistors (20, 22, 24). The values of the input signals determine whether the discharge actually takes place. The period in which the clock signal is high is referred to as the "evaluation phase."

Once the dynamic node is discharged, it will remain low for the rest of the evaluation phase no matter what values the input signals assume after the start of the evaluation phase. Therefore, either the input signals have to settle to their stable values before the start of the evaluation phase or they can settle to a stable high value by making a single rising transition during the evaluation phase.

The inverter (19) in the static output stage (15) is included in the domino gate (11) for several reasons. First, it is required for proper operation of a series of domino gates (11). Secondly, because the dynamic node is a weak node, the inverter (19) separates the dynamic node from components connected to the domino gate (11), alleviating charge-sharing problems and minimizing capacitive coupling.

Figure 3A:
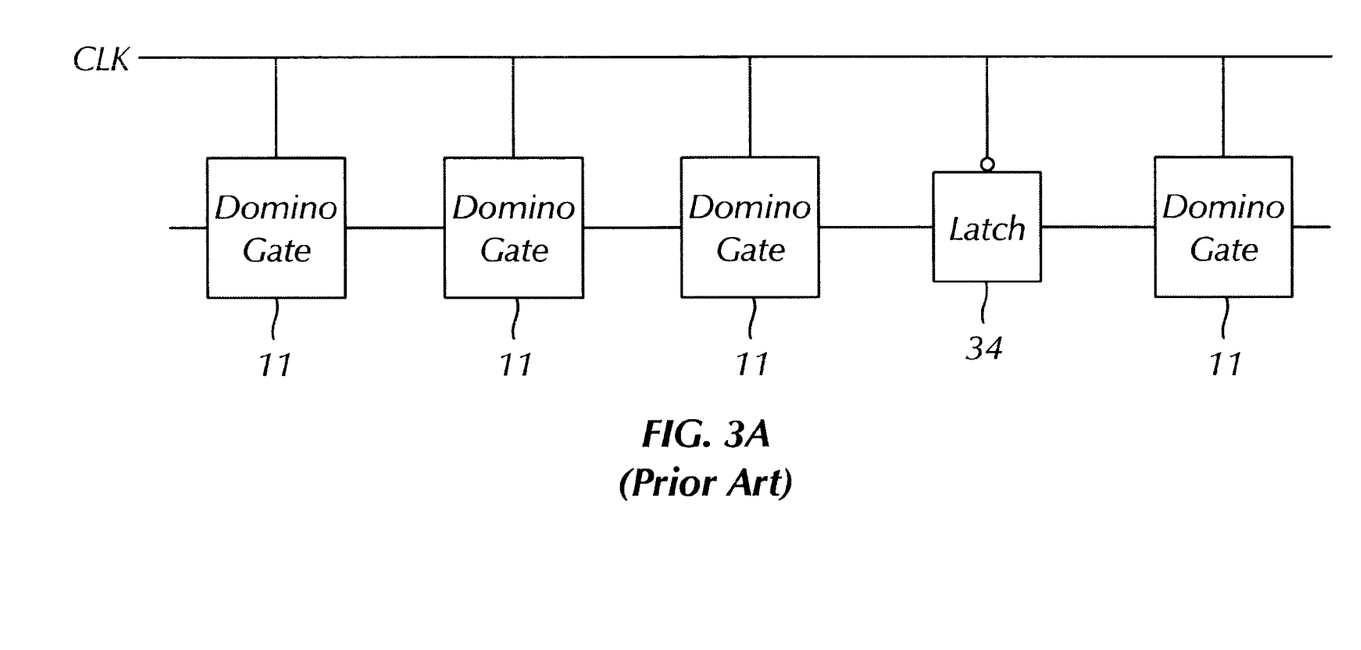
FIG. 3a shows a typical domino gate and storage element configuration.

Because the precharge and evaluation of a domino gate is initiated by a reference clock, uncertainty at the beginning of the rising and falling edge of the reference clock reduces the actual usable time period for operation of a path formed by a series of domino gates. To decrease, or eliminate, the impact of reference clock uncertainty, a special element, such as a latch (34), as shown in FIG. 3a, sequentially follows one or more domino gates.

Figure 3B:
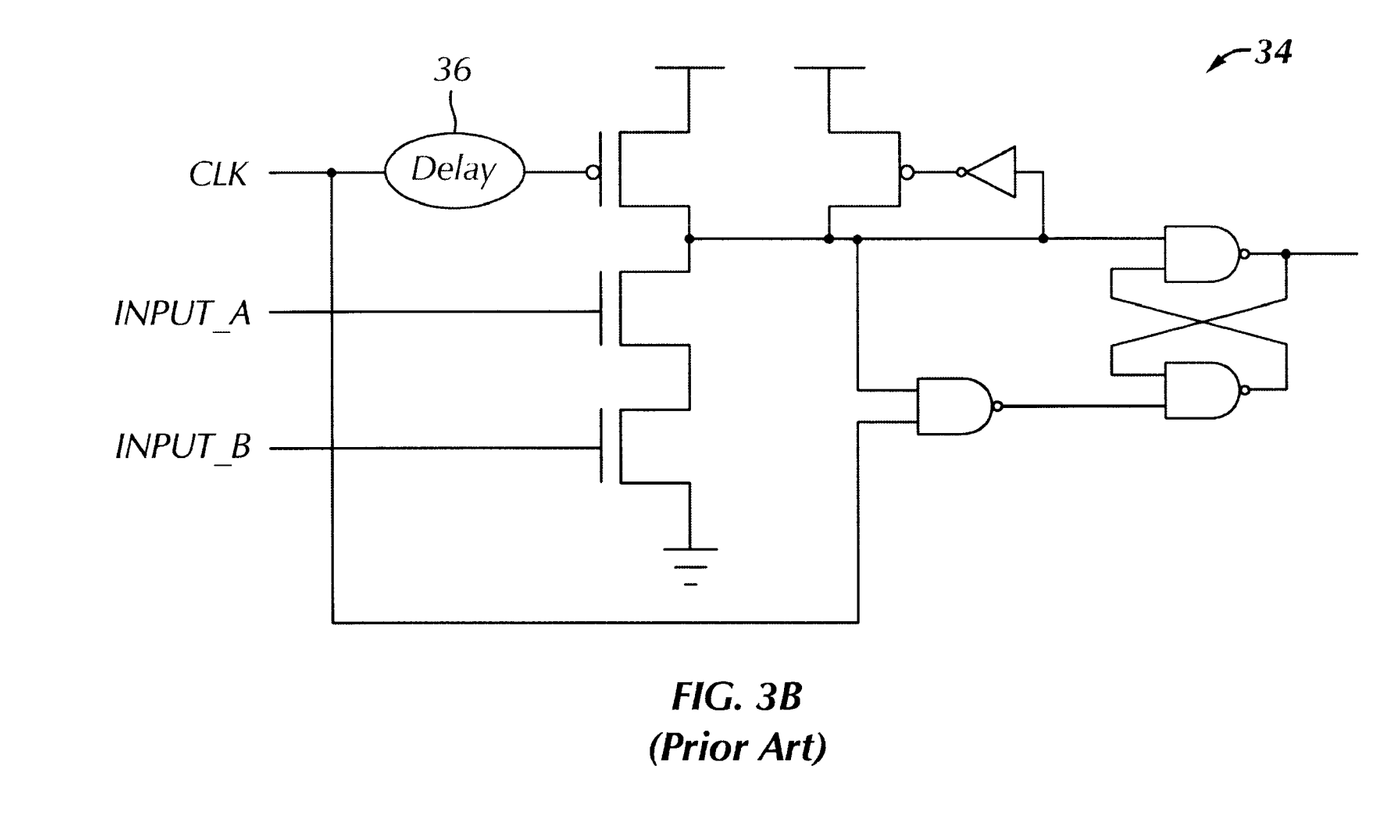
FIG. 3b shows a circuit schematic of the typical latch for a dynamic circuit.

FIG. 3b shows a circuit schematic of the typical latch (34) for a dynamic circuit. Because the latch (34) does not input the reference clock, it is able to capture the result from a dynamic input stage of a domino circuit after the reference clock initiates the evaluation phase. The time between when the reference clock initiates the evaluation phase and the last moment the latch is able to capture the result from the dynamic input stage of the domino circuit is referred to as an "opportunistic time borrowing window." The end of this opportunistic time borrowing window is determined by the start of the precharge phase. By using a delay element (36) to set the opportunistic time borrowing window slightly wider than the reference clock uncertainty, the latch (34) is able to regain the time loss of actual usable time caused by reference clock uncertainty.

In order to test the function of one or more dynamic gates, e.g., domino gates, a "scan test" methodology may be used. Generally, in the scan test methodology, sequential elements are connected in a circuit device or element by using a register like chain known as a "scan path." To begin the "shift," a storage element in the scan path is tapped, that is, selected as the point at which to shift in controlled test bits. Similarly, a sequence of bits may be shifted out from the circuit device at a selected point further down the chain and compared with an expected output. This technique of shifting test data bits in and out is known as "scanning."

However, although including a set-reset flip flop, or other equivalent latch, is desirable in order to reduce domino gate failure, implementing a scan chain to the latch has proven to be extremely challenging because incorporating scan functionality to the set-reset flip flop is very difficult to put into actual practice. Thus, there is a need for a scan capable flip-flop or latch device that can be implemented into a dynamic circuit.

SUMMARY OF INVENTION

According to one aspect of the present invention, an apparatus for scanning a test data sequence into a circuit path comprises a dynamic input stage that receives at least one input during a normal operation, a scannable shadow latch that holds an evaluation result of a circuit in the circuit path, and a logic gate that receives an output from the dynamic input stage and an output from the shadow latch, where the logic gate generates an output of the apparatus, and where, during a scan operation, the scannable shadow latch receives the test data sequence According to another aspect, a scannable latch positioned in a circuit path comprises means for receiving a normal operation input sequence, means for receiving a scan operation input sequence, and means for selecting the input to the circuit path from among the normal operation input sequence and the scanning operation input sequence.

According to another aspect, a method of scanning a test data sequence into a circuit path comprises disabling a normal operation of an input circuit, wherein the input circuit comprises a dynamic input stage and a shadow latch, inputting a scanning operation input sequence into the shadow latch, wherein the shadow latch generates an output, and inputting the shadow latch output to the circuit path.

According to another aspect, a method of scanning a test data sequence into a circuit path comprises a step for disabling a normal operation of an scannable latch, a step for inputting scan test data into a shadow latch during a scan operation, wherein a shadow latch generates an output thereupon, and a step for generating an input to the circuit path from the shadow latch, where the scannable latch comprises the dynamic input stage and the shadow latch.

Other aspects and advantages of the invention will be apparent from the following description and the appended claims.

DETAILED DESCRIPTION

Embodiments of the present invention relate to a scan capable storage element for a dynamic circuit. Embodiments of the present invention further relate to a method for scanning a storage element of a dynamic circuit.

Figure 4:
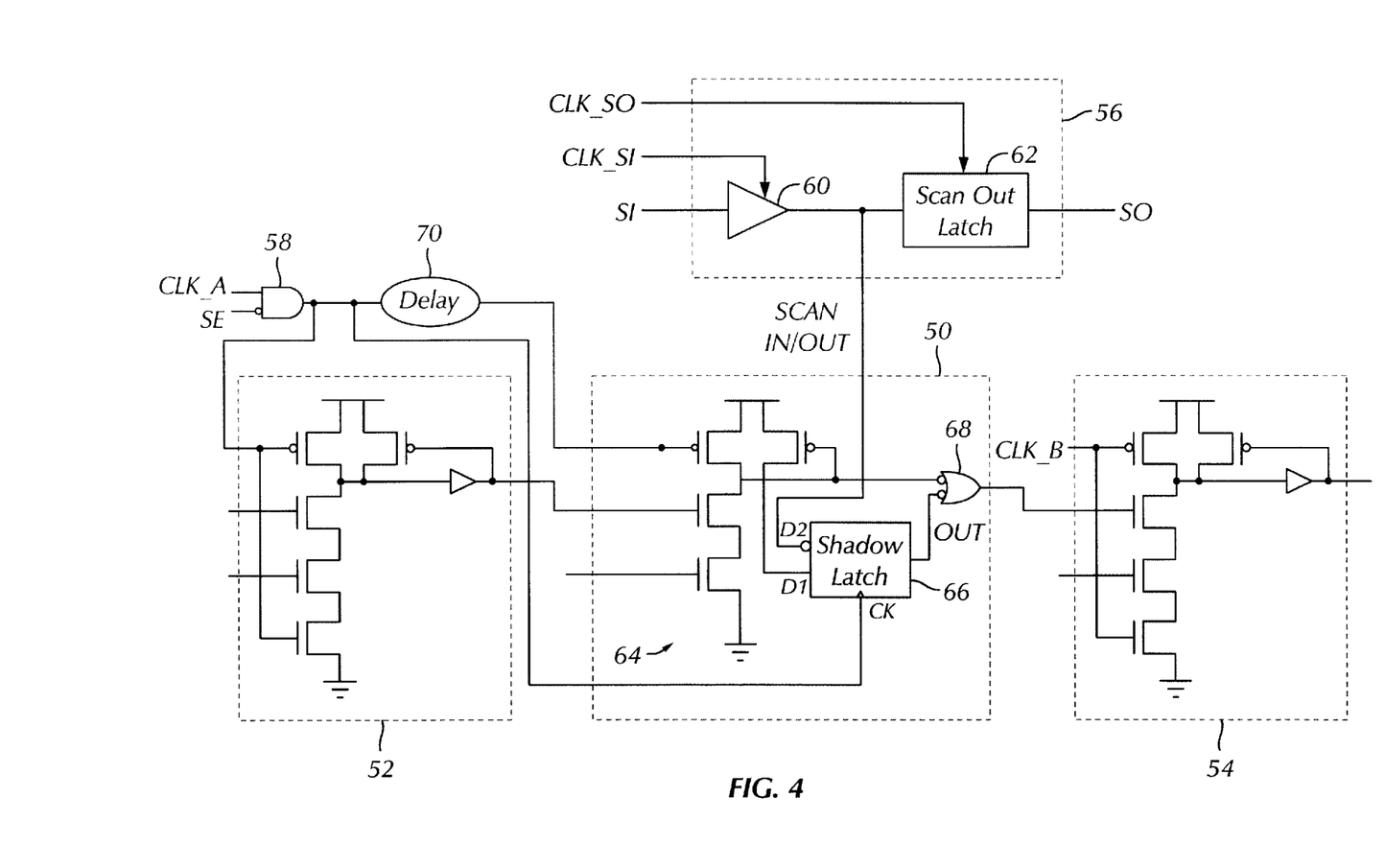
FIG. 4 shows a scannable latch in accordance with an embodiment of the present invention.

FIG. 4 shows an exemplary scannable latch (50) implementation in accordance with an embodiment of the present invention. Particularly, FIG. 4 broadly includes two separate domino gates (52, 54) that are part of a larger series (not shown) of domino gates, where the first and second domino gates (52, 54) have configurations similar to the domino gate shown in FIG. 2. The "tap-in" point for scan purposes is selected between the two domino gates (52, 54). A scan signal generator (56) generates a series of test bits to be scanned into the series of domino gates through the scannable storage element (50).

An AND gate (58) controls a clock signal (shown in FIG. 4 as CLK_A) to the first domino gate (52). Upon receipt of an active scan enable signal (shown in FIG. 4 as SE), the AND gate (58) will block the clock signal from the first domino gate (52) and allow a scanning operation to commence.

The scan signal generator (56) has a buffer (60) and a scan-out latch (62). A scan-in clock signal (shown in FIG. 4 as CLK_SI) and the series of test bits (shown in FIG. 4 as SI) serve as inputs to the buffer (60), which, in turn, outputs a scan-out signal (shown in FIG. 4 as SO). The scan-out signal is then split into separate paths, where one path goes to the scan-out latch (62) where it is held until clock out of the scan signal generator (56) by a scan-out clock signal (shown in FIG. 4 as CLK_SO) for use elsewhere and where the other path serves as an input to the scannable latch (50).

The scannable latch (50) has a dynamic input stage (64) (similar to that of the first and second domino gates (52, 54)), a shadow latch (66), and a static output gate (68). The shadow latch (66) has a data input (shown in FIG. 4 as D1) to capture a value from the dynamic input stage (64), an inverted bi-directional scan data port (shown in FIG. 4 as D2) to shift in/out scan data, a data output (shown in FIG. 4 as OUT) that serves as an input to the static output gate (68), and a clock input (shown in FIG. 4 as CK) that is used to reset the shadow latch (66) at the beginning of an evaluation phase. Further, a delay element (70) is positioned on the output from the AND gate (58) before the dynamic input stage (64) in order to ensure that the delay in the arrival time of the clock signal from the AND gate (58) is slightly longer than the clock uncertainty on the clock signal.

Figure 5:
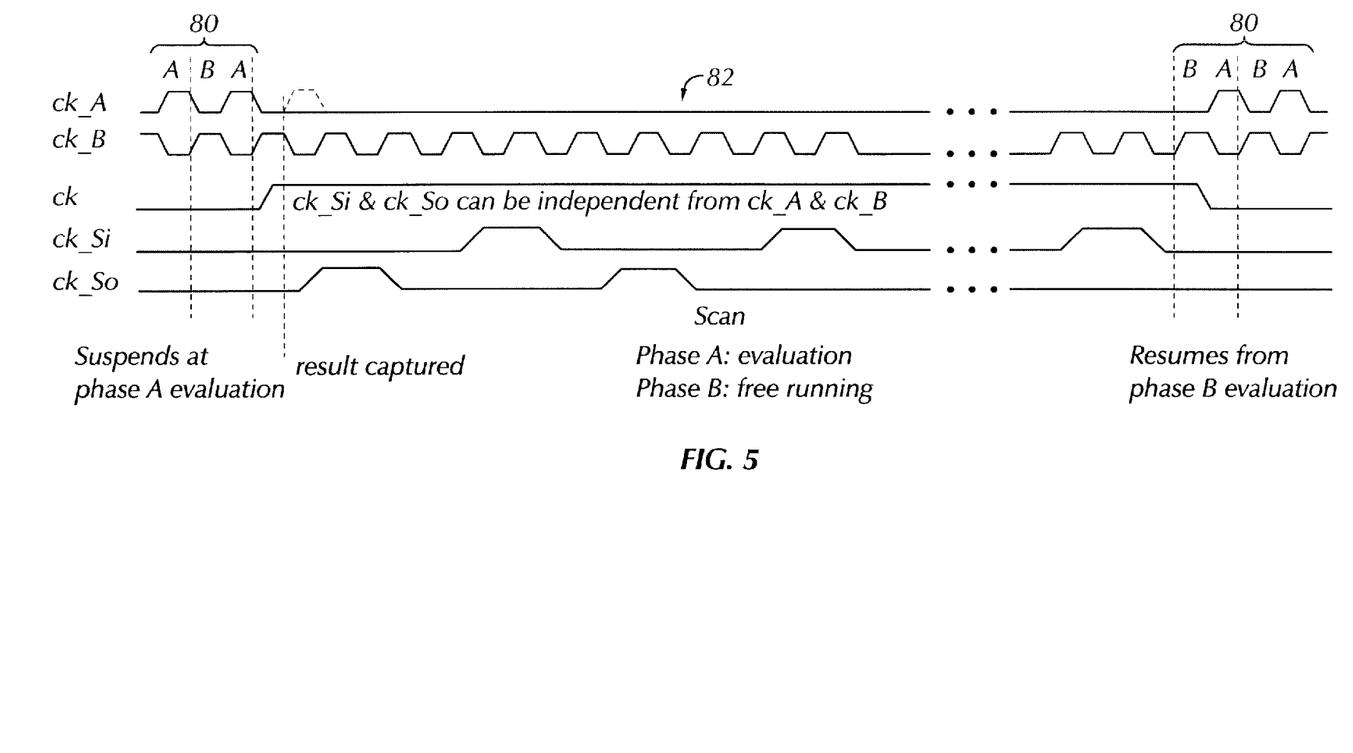
FIG. 5 shows a timing diagram in accordance with the embodiment shown in FIG. 4.

FIG. 5 shows an exemplary timing diagram in accordance with the embodiment shown in FIG. 4. The timing diagram shows the performance of the broadly shown circuit in FIG. 4 during normal operation (80) occurring prior to and subsequent to a scanning operation (82). The CLK_A and CLK_B signals operate continuously with their respective domino gates (52, 54). Once the scan enable signal goes high, the scanning operation begins. The CLK_A signal is deactivated while the existing scan-out clock signal is captured. The cycling of the scan-in clock signal and the scan-out clock signal continues until the scanning operation is ended by the scan enable signal going low. The scan-in and scan-out clock signals operate independently from the higher frequency CLK_A and CLK_B signals. This independent operation allows the scan-in and scan-out clock signals to operate at a lower frequency and operate without synchronization with respect to the CLK_A and CLK_B signals.

Figure 6A:
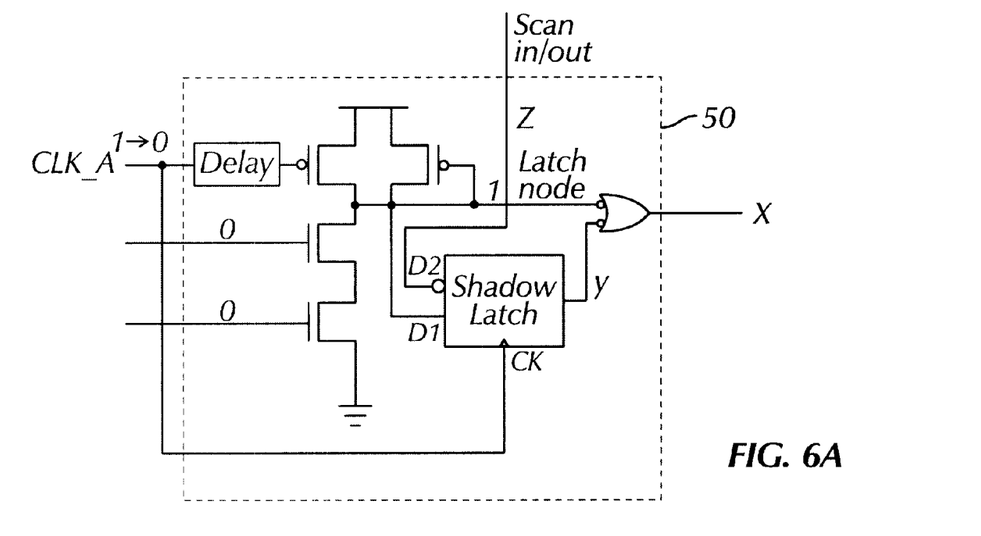
FIGS. 6a–6c show a series of states during a scan operation of a scannable latch in accordance with an embodiment of the present invention.
Figure 6B:
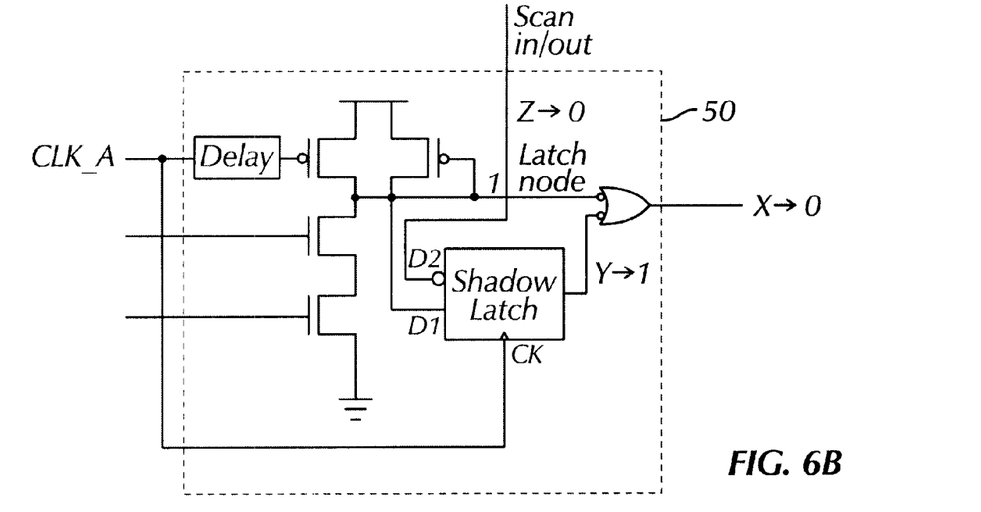
Figure 6C:
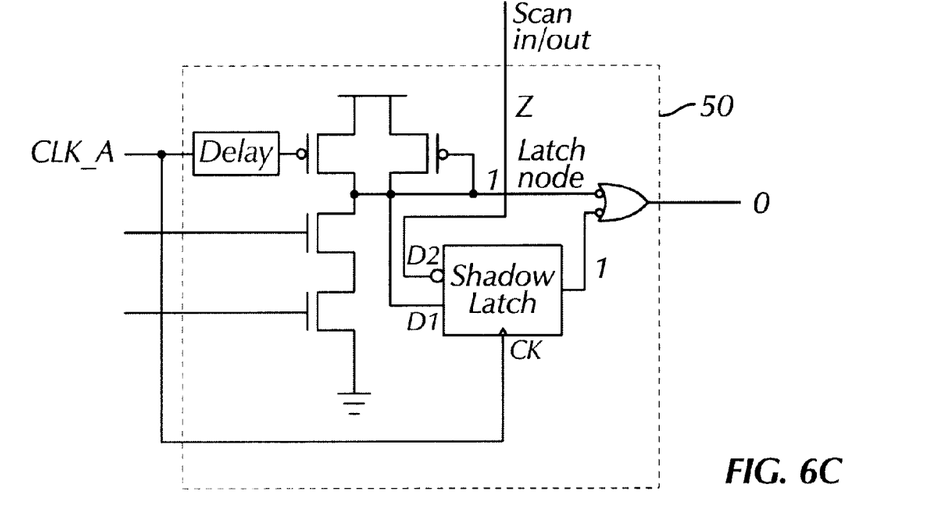

FIGS. 6a–6c shows exemplary schematics of the scannable latch (50) during a scan in '0' operation. FIG. 6a shows an initial step of disabling the CLK_A signal to '0.' When CLK_A is disabled, an internal latch node (shown in FIGS. 6a–6c as LATCH_NODE) is set to '1' via a connection to high through a transistor switched on by the low CLK_A signal.

Once CLK_A has been disabled and the internal latch node is set high, a scan in value (shown in FIGS. 6a–6c as Z), the output of the shadow latch (66) (shown in FIGS. 6a–6c as Y), and the output of the static output gate (68) and the scannable latch (50) (shown in FIGS. 6a–6c as X) are at their respective values prior to the beginning of the scanning operation.

Figure 7A:
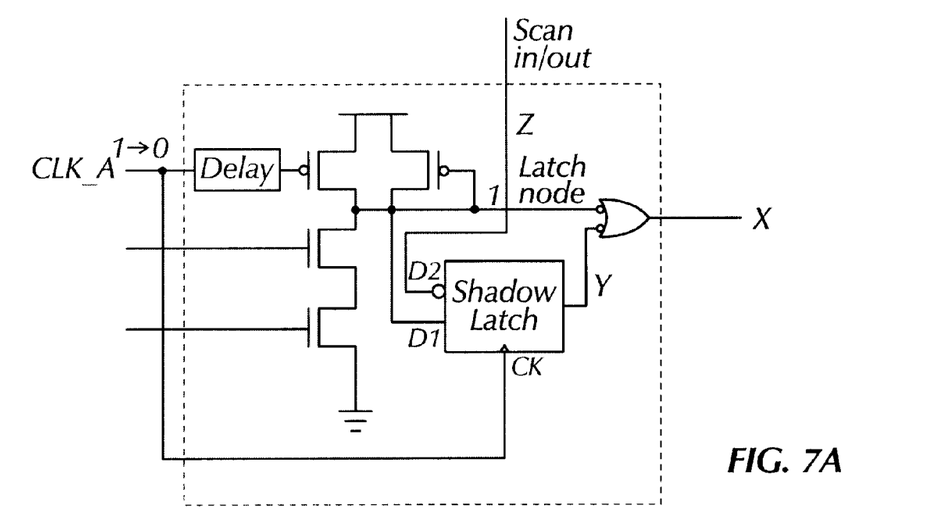
FIGS. 7a–7c show a series of states during a scan operation of a scannable latch in accordance with an embodiment of the present invention.
Figure 7B:
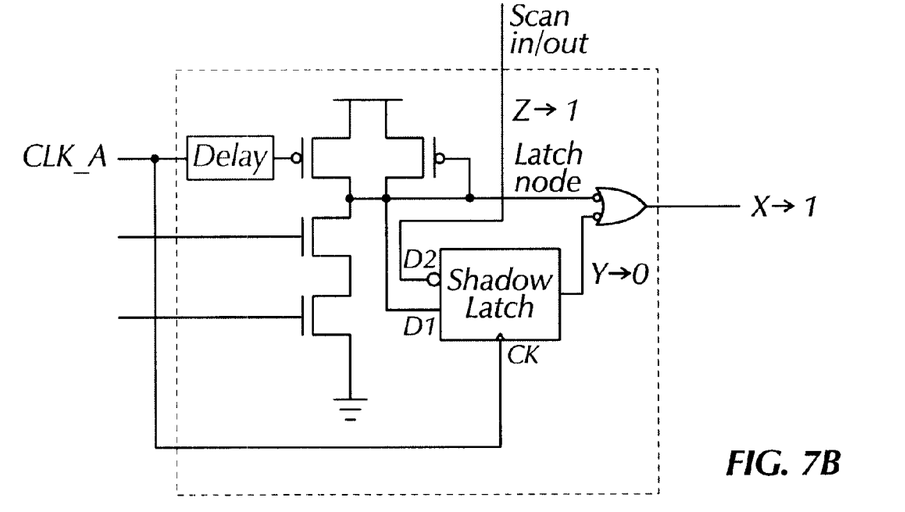
Figure 7C:
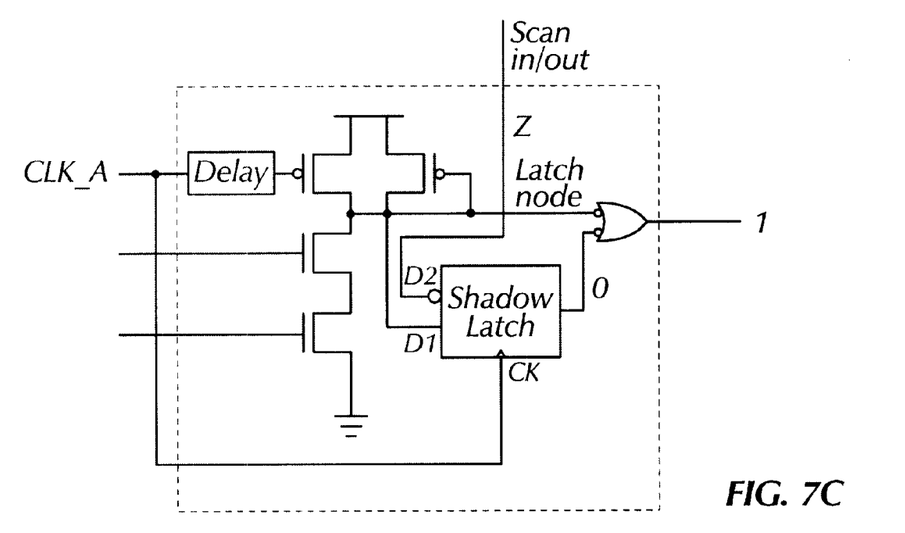

Referring now to FIG. 6b, Z transitions to '0' as a '0' value is scanned into the scannable latch (50). Thereafter, Y transitions to '1' due to the inverted input of the shadow latch (66) at the node on which Z resides. Y is again inverted at the input of the static output gate (68). Because the inputs to the dynamic input stage (64) are '0' during a scan operation due to the input signals to the first domino gate (52) being disabled, the internal latch node remains at '1' throughout the scanning operation. Thus, the static output gate (68) as shown in FIGS. 7a–7c behaves as an inverter of Y. It follows that as Y transitions to '1,' X transitions to '0.'

Referring now to FIG. 6c, the state of the scannable latch (50) after the scan in '0' operation is shown. Particularly, X is '0,' Y is '1,' and the node on which Z resides awaits a next data value to be scanned into the scannable latch (50).

FIGS. 7a–7c shows exemplary schematics of the scannable latch (50) during a scan in '1' operation. FIG. 7a shows an initial step of disabling the CLK_A signal to '0.' When CLK_A is disabled, an internal latch node (shown in FIGS. 7a–7c as LATCH_NODE) is set to '1' via a connection to high through a transistor switched on by the low CLK_A signal.

Once CLK_A has been disabled and the internal latch node is set high, a scan in value (shown in FIGS. 7a–7c as Z), the output of the shadow latch (66) (shown in FIGS. 7a–7c as Y), and the output of the static output gate (68) and the scannable latch (50) (shown in FIGS. 7a–7c as X) are at their respective values prior to the beginning of the scanning operation.

Referring now to FIG. 7b, Z transitions to '1' as a '1' value is scanned into the scannable latch (50). Thereafter, Y transitions to '0' due to the inverted input of the shadow latch (66) at the node on which Z resides. Y is again inverted at the input of the static output gate (68). Because the inputs to the dynamic input stage (64) are '0' during a scan operation due to the input signals to the first domino gate (52) being disabled, the internal latch node remains at '1' throughout the scanning operation. Thus, the static output gate (68) as shown in FIGS. 7a–7c behaves as an inverter of Y. It follows that as Y transitions to '0,' X transitions to '1.'

Referring now to FIG. 7c, the state of the scannable latch (50) after the scan in '1' operation is shown. Particularly, X is '1,' Y is '0,' and the node on which Z resides awaits a next data value to be scanned into the scannable latch (50).

Figure 8A:
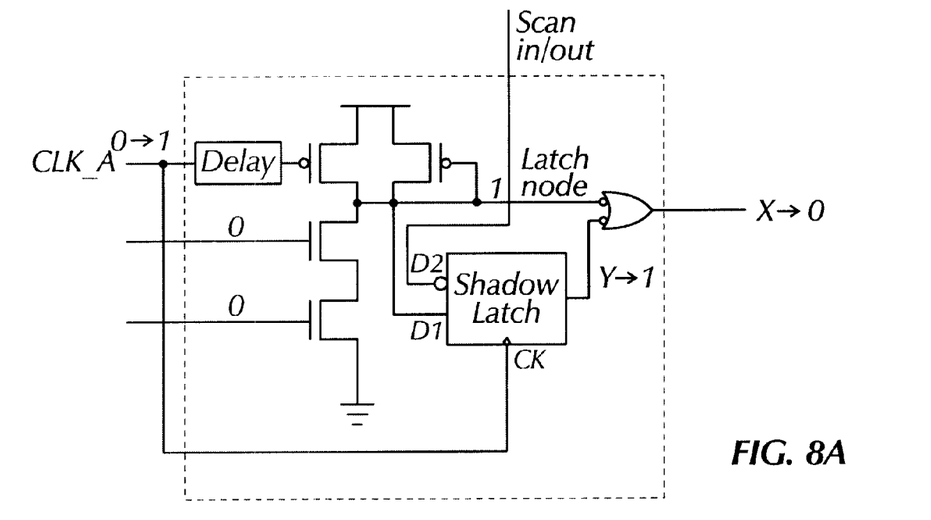
FIGS. 8a and 8b show a series of states during an evaluation phase of a scannable latch in accordance with an embodiment of the present invention.
Figure 8B:
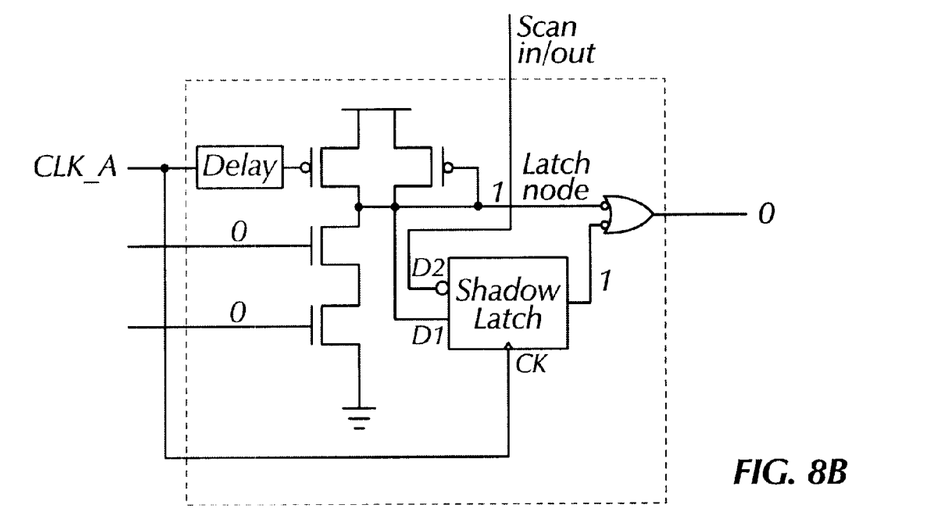

FIGS. 8a and 8b show exemplary schematics of the scannable latch (50) during an evaluation phase. Particularly, the operation shown is an evaluation of a '0' value. FIG. 8a shows an initial step of resetting the scannable latch (50) as CLK_A transitions from '0' to '1.' Thereafter, Y transitions to '1' causing X to transition to '0.' This '0' value represents the reset value for the scannable latch (50).

Referring now to FIG. 8b, the state of the scannable latch (50) after the start of the evaluation of '0''s is shown. Because the series of transistors in the pulldown path remain 'off,' an internal latch node (shown in FIGS. 8a and 8b as LATCH_NODE) remains high. Thus, Y remains at '1' and X remains at '0.'

Figure 9A:
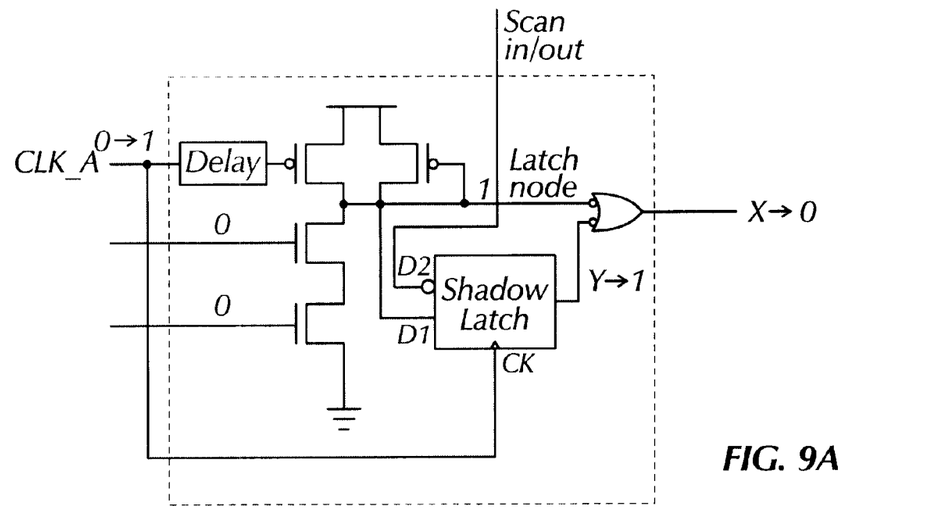
FIGS. 9a and 9b show a series of states during an evaluation phase of a scannable latch in accordance with an embodiment of the present invention.
Figure 9B:
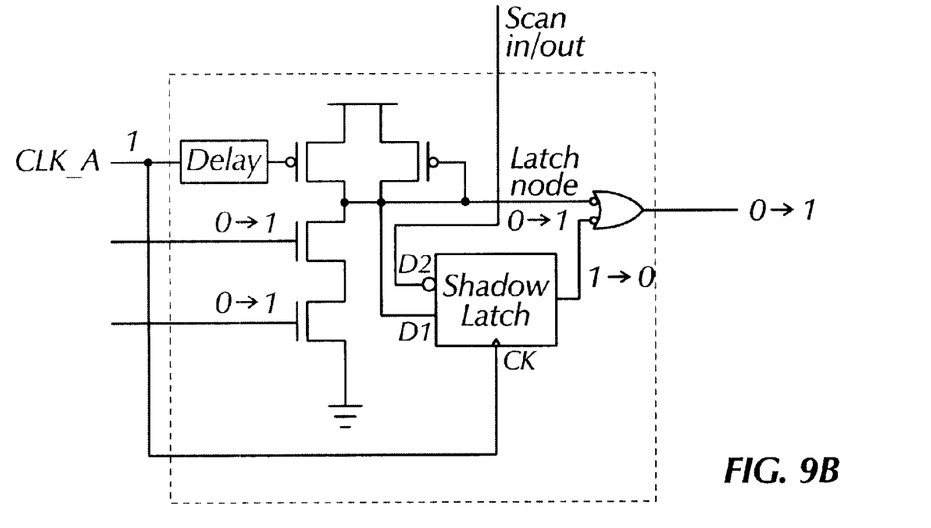

FIGS. 9a and 9b show exemplary schematics of the scannable latch (50) during an alternative evaluation phase. Particularly, the operation shown is an evaluation of a '0' value. FIG. 9a shows an initial step of resetting the scannable latch (50) as CLK_A transitions from '0' to '1.' Thereafter, Y transitions to '1' causing X to transition to '0.' This '0' value represents the reset value for the scannable latch (50).

Referring now to FIG. 9b, the state of the scannable latch (50) after the start of the evaluation of '1''s is shown. Because the series of transistors in the pulldown path switch 'on,' an internal latch node (shown in FIGS. 9a and 9b as LATCH_NODE) gets discharged through the pulldown path. Thus, Y goes low. Because both inputs to the static output gate (68) are now low, the static output gate (68), as configured in FIGS. 9a and 9b, causes X to transition to a '1.'

Those skilled in the art will appreciate that although the various embodiments of the scannable latch show an output static gate with a particular configuration, alternative embodiments consistent with the present invention may use output static gates have different, yet functionally equivalent, configurations.

The scannable latch (50) as shown in the various embodiments of the present invention uses a "time borrowing" technique in its operation. With this technique, the precharge phase is delayed in order to mask the uncertainty of the falling edge of the reference clock. This delay causes an overlap between the circuit currently in an evaluation phase and subsequent domino circuits. The length of this overlap should be longer than the period of edge uncertainty. In the various embodiments shown, the shadow latch (66) acts as a slave latch that holds a copy of an evaluation phase result. This induces the overlap delay for the scannable latch (50).

Advantages of the present invention may include one or more of the following. In some embodiments, because a scannable latch is used with one or more dynamic circuits, scan test operations may occur while reducing, or eliminating, adverse affects of clock uncertainty.

In some embodiments, a shadow latch may be easily used in a scan-in procedure due to a single wire connection between a scan signal generator and a shadow latch. The single wire connection facilitates a self-contained, modular attachability to a scannable latch. Those skilled in the art will appreciate that this allows a circuit designer the flexibility to add or remove the circuit form a particular series of domino circuits quickly and easily.

In some embodiments, because a feedback loop of a dynamic input stage of a scannable latch is not exposed outside the scannable latch itself, the scannable latch is more robust and stable during operation.

In some embodiments, because there is only one gate between a dynamic input stage and an output of a scannable latch, evaluation speeds in non-scan operations may run as fast as other non-scan dynamic latches.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus for scanning a test data sequence into a circuit path, comprising:
   a dynamic input stage that receives at least one input during a normal operation;
   a scannable shadow latch that holds an evaluation result of a circuit in the circuit path, wherein, during a scan operation, the scannable shadow latch receives the test data sequence, and wherein, the scannable shadow latch has an input operatively connected to a clock signal; and
   a logic gate that receives an output from the dynamic input stage and an output from the shadow latch, wherein the logic gate generates an output of the apparatus.

2. The apparatus of claim 1, wherein the circuit path comprises at least one domino circuit.

3. The apparatus of claim 1, wherein the apparatus is operatively connected to the circuit in the circuit path.

4. The apparatus of claim 1, wherein the at least one input comprises:
   at least one data bit;
   a clock signal.

5. The apparatus of claim 4, wherein the clock signal is disabled during the scan operation, wherein a scan enable signal is enable during the scan operation, and wherein the scan enable signal is operatively connected to the scannable shadow latch.

6. The apparatus of claim 1, wherein the scannable shadow latch receives the test data sequence from a single signal line.

7. The apparatus of claim 1, wherein the logic gate is an OR gate.

8. The apparatus of claim 1, wherein the apparatus is a self-contained module.

9. The apparatus of claim 1, wherein the dynamic input stage is a domino gate.

10. A method of scanning a test data sequence into a circuit path, comprising:

disabling a normal operation of an input circuit, wherein the input circuit comprises a dynamic input stage and a shadow latch;

inputting a scanning operation input sequence into the shadow latch, wherein the shadow latch generates an output; and inputting the shadow latch output to the circuit path.

11. The method of claim 10, wherein the normal operation of the input circuit is disabled by disabling a reference clock to the input circuit.

12. The method of claim 10, wherein the scanning operation input sequence serves as an input to the shadow latch through a single signal line.

13. The method of claim 10, wherein inputting the shadow latch output to the circuit path is controlled by a logic gate.

14. The method of claim 13, wherein the logic gate is operatively connected to the dynamic input stage and the shadow latch.

15. The method of claim 10, wherein the input circuit functions as a dynamic gate during normal operation.

16. The method of claim 15, wherein the input circuit, during normal operation, has a timing delay longer than a period of reference clock uncertainty to a dynamic circuit operatively connected to the input circuit.

17. The method of claim 10, wherein the input circuit is a self-contained module.

18. The method of claim 10, wherein the circuit path comprises a series of domino gates.

19. A method of scanning a test data sequence into a circuit path, comprising:

a step for disabling a normal operation of an scannable latch, wherein the scannable latch comprises a dynamic input stage and a shadow latch;

a step for inputting scan test data into the shadow latch during a scan operation, wherein the shadow latch generates an output thereupon; and a step for generating an input to the circuit path from the shadow latch.

20. A scannable latch, comprising:

dynamic input means for receiving normal operation data;

latching means for receiving scan operation data, wherein the latching means is dependent on a clock signal; and means for generating an output of the scannable latch dependent on the dynamic input means and the latching means.

* * * * *